US012731922B2

(12) United States Patent
Mays

(10) Patent No.: US 12,731,922 B2
(45) Date of Patent: Sep. 8, 2026

(54) METHOD AND APPARATUS FOR SURFACE MOUNT CONNECTIONS

(71) Applicant: CIENA CORPORATION, Hanover, MD (US)

(72) Inventor: Russell Mays, Stockton, CA (US)

(73) Assignee: CIENA CORPORATION, Hanover, MD (US)

(*) Notice: Subject to any disclaimer, the term of this patent is extended or adjusted under 35 U.S.C. 154(b) by 853 days.

(21) Appl. No.: 18/154,658

(22) Filed: Jan. 13, 2023

(65) Prior Publication Data

US 2024/0243496 A1 Jul. 18, 2024

(51) Int. Cl.

| | |
|---|---|
| ***H01R 12/57*** | (2011.01) |
| ***H01R 25/00*** | (2006.01) |
| ***H01R 43/02*** | (2006.01) |
| ***H05K 1/02*** | (2006.01) |
| ***H05K 1/11*** | (2006.01) |
| ***H05K 1/181*** | (2026.01) |

(52) U.S. Cl.

CPC ........... *H01R 12/57* (2013.01); *H01R 25/006* (2013.01); *H01R 43/0256* (2013.01); *H05K 1/0228* (2013.01); *H05K 1/113* (2013.01); *H05K 1/181* (2013.01); *H05K 2201/09227* (2013.01); *H05K 2201/09409* (2013.01); *H05K 2201/09481* (2013.01); *H05K 2201/09609* (2013.01); *H05K 2201/10189* (2013.01); *H05K 2201/10545* (2013.01)

(58) Field of Classification Search

CPC .............................. H01R 12/57; H01R 25/006

See application file for complete search history.

(56) References Cited

U.S. PATENT DOCUMENTS

| | | | | |
|---|---|---|---|---|
| 6,537,086 | B1 * | 3/2003 | Mac Mullin | H01R 12/00 439/79 |
| 7,931,481 | B2 | 4/2011 | Yamakami | |
| 2024/0243496 | A1 * | 7/2024 | Mays | H01R 12/727 |

FOREIGN PATENT DOCUMENTS

| | | | |
|---|---|---|---|
| CN | 113690649 | A | 11/2021 |
| IN | 202547071447 | A | 8/2025 |

OTHER PUBLICATIONS

International Search Report & Written Opinion for PCT/US2024/011326 mailed Apr. 17, 2024, 11 pgs.

"International Preliminary Report on Patentability", PCT/US2024/011326, Jul. 24, 2025.

* cited by examiner

*Primary Examiner* — Neil Abrams

(74) *Attorney, Agent, or Firm* — Guntin & Gust, PLC; Daniel P. Williams

(57) ABSTRACT

Aspects of the subject disclosure may include, for example, a device including a connector having a connector body and one or more rows of pins, where the connector facilitates a pluggable connection to an electrical cable or pluggable transceiver, where at least one of the one or more rows of pins includes a first group of the pins extending in a first direction and a second group of the pins extending in a second, different direction. The device includes a host board having vias, where at least a portion of the first and second groups of pins are connected with a portion of the vias by way of solder joints. Other embodiments are disclosed.

20 Claims, 9 Drawing Sheets

100

PRIOR ART

200

250

301

407

600

METHOD AND APPARATUS FOR SURFACE MOUNT CONNECTIONS

FIELD OF THE DISCLOSURE

The subject disclosure relates to a method and apparatus for surface mount connections.

BACKGROUND

In current surface mount connections, trace escape directions may be pre-determined by construction of a connector component such as based on either a row of "J-formed" pins or a row of "L-formed" pins. The location of the layer transition vias on the host board can thus be limited. While this constraint may be of less of a concern for Printed Circuit Boards (PCBs) designed with a single connector located on only one side of the PCB, however, for PCBs being designed to support high-density optics plugs on a product faceplate, a "belly-to-belly" arrangement is often used where there is a high-speed connector on both the top and bottom sides of the PCB. In such an arrangement, the typical placement area for the vias for the top and bottom connectors fall in the same area. Since the connectors are oriented on opposite sides of the PCB, the RX signal vias from the top connector align directly with the TX vias from the bottom connector and vice-versa. This poses a significant risk of cross-talk, particularly if the vias are not properly separated or otherwise shielded from each other.

FIG. 1 illustrates a prior art host board layout 100 including a PCB 140 with a connector 150, and where a stub 115 has formed in the signal path. Stubs cause signal reflections which disrupt the transmission and ultimately contribute to SERDES eye closure in both vertical amplitude and horizontal time/width. FIG. 1 shows an improper trace escape for the trace 110 where the via 130 (which can be formed via a backdrill 135) is located or otherwise positioned at the "heel" of the pin 105 and the footprint pad 120.

FIGS. 2A and 2B illustrate a prior art high-speed host board layout 200 including a PCB 240 with a connector 250. Layout 200 includes a contemporary layout utilizing belly-to-belly placed Surface Mount Technology (SMT) connectors that are SFP112 components, but is also a prior art layout that can utilize various Small Formfactor Pluggable (SFP) components or connectors, including SFPxx, QSFPxx, and OSFP family connectors. This connector 250 has two rows of ten pins each that are all "L" pins (or pins that bend in an L-like shape). The prior art layout 200 illustrates that TX vias from the top connector are directly adjacent to the RX vias from the bottom connector. Similarly, RX vias from the top connector are directly adjacent to the TX vias from the bottom connector. Additional or increased surface trace length (microstrip) is required to provide some separation. Also, the microstrip traces pass directly beneath the boundary of the connectors, where the SFP press-fit cage would be installed. The proximity of the cage to the surface of the PCB can interact with the microstrip routed signals, adding discontinuity and also radiated emissions concerns. Further, since all pins within a row are formed as "L-bend" on these connectors, the high-speed area of the connectors becomes very crowded with GND return vias (in an irregular or non-symmetrical pattern) and with anti-pad spacing required for signal separation of the RX and TX signal vias.

The prior art layout 200 makes impedance control more difficult and creates discontinuity through use of extended microstrip traces. Adding distance between the signal traces and the layer-transition vias requires a longer segment of outer layer (microstrip) trace to be designed. Impedance control of microstrip traces has a worse accuracy tolerance, which can result in poor impedance matching with the connector, vias, and stripline (inner layer) routing. Microstrip trace impedances are affected by solder-mask, Cu plating process, and proximity of components/cables/etc. to the surface of the PCB. These impedance discontinuities contribute to reflections, return loss, signal attenuation, and ultimately SERDES eye closure.

The prior art layout 200 creates crosstalk issues due to the RX/TX vias in close proximity. Even with the extended microstrip traces and moved vias, the RX and TX layer transition vias from the top/bottom connectors are still in close proximity to each other, risking crosstalk and reduced SNR.

The prior art layout 200 also creates via-crowding where via anti-pads can impede GND and Power planes, blocking power and return paths. Too many vias crowded in a small area creates design difficulties, as well as complicating and making more difficult the PCB manufacturing process. Each via requires anti-pad voids on power and GND plane layers. Backdrill requirements to remove via stubs adds further requirements to the via anti-pad dimension, requiring more clearance on plane layers.

Contemporary techniques of increasing the distance of the layer transition vias away from the connector footprint and/or increasing microstrip routing length to address belly-to-belly connector placement and via break-out have a number of drawbacks as described herein. In order to reduce the cross-talk concern between RX and TX signal vias for connectors on opposite sides of the board, additional microstrip routing length is sometimes used between the connector and via as needed. In prior art devices where microstrip traces reference only one ground plane, there is risk of impedance mismatch due to outer layer Cu plating, solder mask characteristics, proximity of components to the surface of the PCB, and so forth.

BRIEF DESCRIPTION OF THE DRAWINGS

Reference will now be made to the accompanying drawings, which are not necessarily drawn to scale, and wherein.

DETAILED DESCRIPTION

Figure 1:
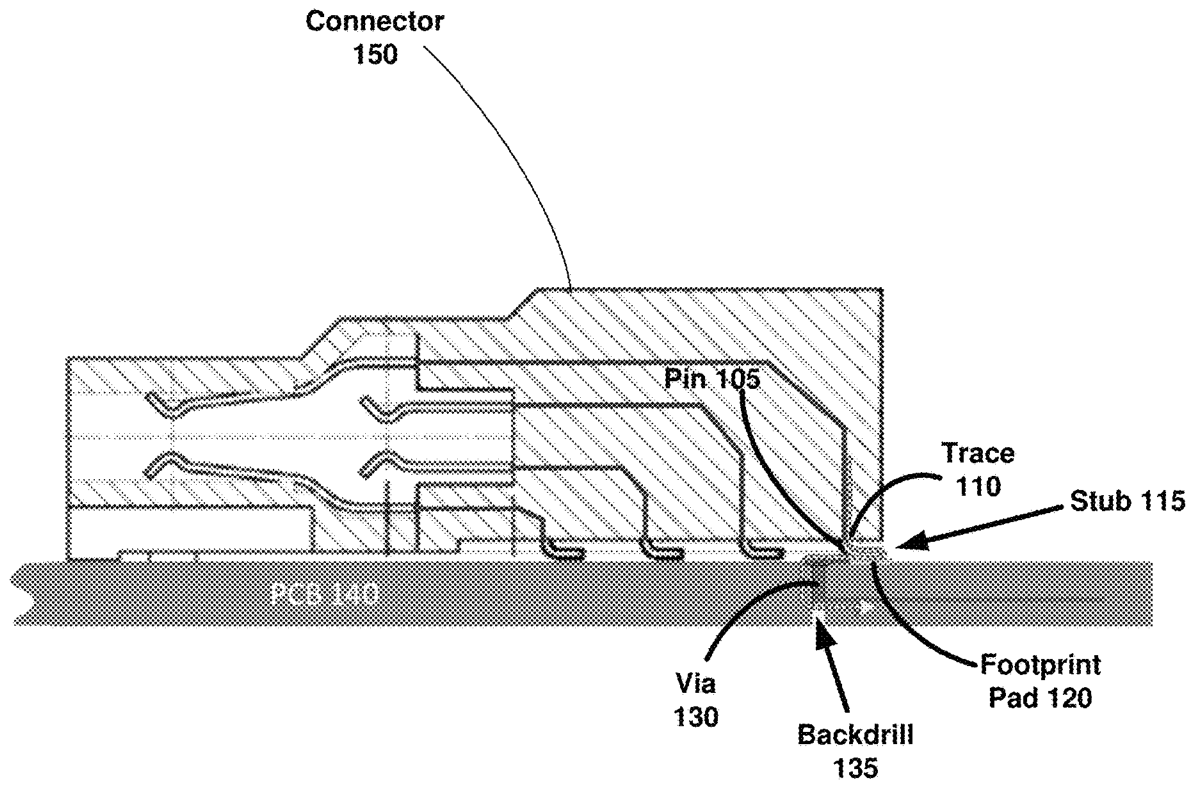
FIG. 1 is a schematic diagram of a prior art device having a surface mounted connector.
Figures 2A, 2B:
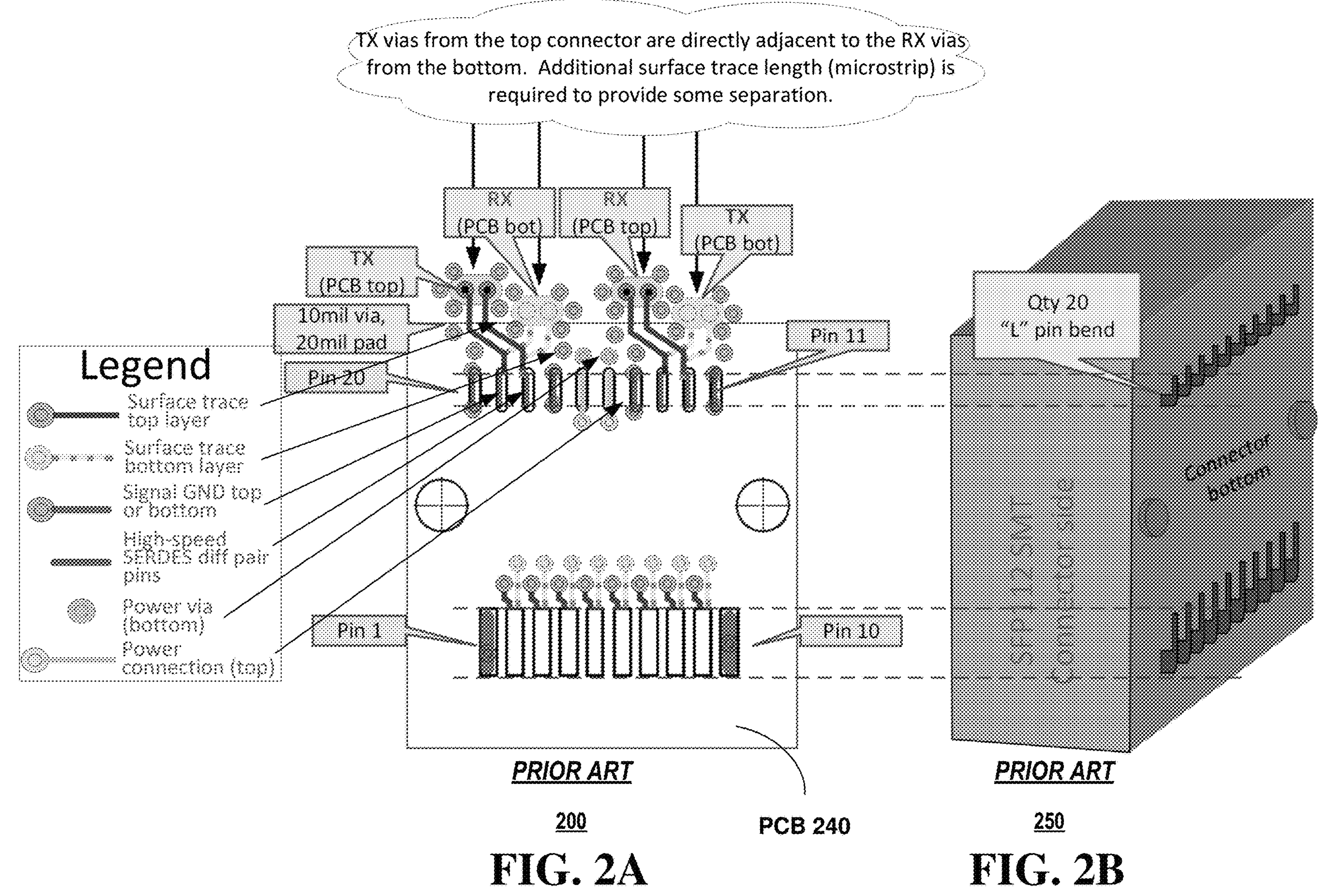
FIGS. 2A-2B are schematic diagrams of another prior art device having a surface mounted connector.

The subject disclosure describes, among other things, illustrative embodiments for devices including connectors for connection to electrical and/or fiber cables, such as pluggable connections. The connectors can be secured to host boards and can include rows of pins extending in different directions, such as opposite directions to optimize or improve trace routes along the host board to which the connector is mounted. Other embodiments are described in the subject disclosure.

In one or more embodiments, high-speed SMT connectors are provided that are or can be mounted to a PCB, including in a belly-to-belly arrangement providing 56 or 112 Gbps SERDES rate or higher, although other signaling rates can be implemented or otherwise achieved.

In one or more embodiments, a signal pin orientation and arrangement can be used in the construction of SMT connectors assembled on a PCB (e.g., a belly-to-belly arrangement) such that the PCB traces escape the connector footprints on the top and bottom sides of the PCB in an optimized or improved manner which minimizes signal discontinuities, stub reflections, and allows layer transition vias for RX/TX differential pairs to be located further apart, thus minimizing cross-talk.

In one or more embodiments, the SMT connector(s) have one or more rows with pins in different directions (e.g., a first series of pins in a first direction and then a second series of pins in a second direction), which may be an opposite direction (e.g., 180 degree difference) or different than an opposite direction (e.g., less than 180 degree difference or more than 180 degree difference). By providing pins in the rows with different directions, the PCB can be constructed to provide spacing of upper and lower vias.

In one or more embodiments, the signal pins in the connector(s) use a combination of “L” and “J” bend directions at the PCB contact point (when viewed from the side profile) which provides a parallel solderable pin surface to the PCB which accepts the solder during IR reflow and provides a reliable solder joint. These bend directions provide high-speed optics plug SMT connectors with favorable soldering characteristics.

In one or more embodiments, by combining both “J-formed” and “L-formed” pin leads on the same row(s) of a connector(s), the “toes” of the connector pins on opposite sides of a PCB will be facing in opposite directions. This allows for the layer transition vias for the top/bottom connectors to be placed away from each other, avoiding issues with cross-talk, impedance discontinuities, and via anti-pads blocking GND and Power current paths.

In one or more embodiments, improvement to mitigating signal interference is provided by utilizing the pin configuration described herein in both the RX and TX directions for connections between a switch ASIC and a pluggable optic module. PCBs can thus be designed and manufactured with a better ability to meet electrical standards such as IEEE802.3ck.

In one or more embodiments, connector/via discontinuities are reduced which results in increased budget for PCB routing length. This allows more connectors/ports to be designed at the faceplate, and in some embodiments without the need for Over-the-Board (OTB) or fly-over cables. In one or more embodiments, the connectors described herein can be utilized with optics plugs operating with 112 Gbps SERDES.

In one or more embodiments, connectors having both “L” and “J” pin bends on the same connector row allow trace escapes with minimal or reduced micro-strip routing that has several benefits, such as when used in belly-to-belly configuration, including less discontinuity transition between pin/micro-strip/via (shorter surface traces), less chances of cross-talk between RX/TX of top/bottom connector signals, shorter microstrip which provides less chance of radiated emissions issue in compliance testing, less dependency on surface trace geometry (micro-strip) impedance which can be difficult to control due to Cu plating thickness build-up, over-etching, and so forth.

One or more aspects of the subject disclosure include a connector, comprising a connector body that facilitates a pluggable connection to an electrical cable or pluggable transceiver; and one or more rows of pins extending from a surface of the connector body. At least one of the one or more rows of pins includes a first group of the pins extending in a first direction and a second group of the pins extending in a second direction that is opposite to the first direction. At least a portion of the first and second groups of pins are adapted for connection with vias of a host board by way of solder joints.

One or more aspects of the subject disclosure include a device, comprising a first connector and a host board. The first connector includes a first connector body and one or more first rows of first pins extending from the first connector body, where the first connector facilitates a pluggable connection to a first electrical cable or pluggable transceiver, where at least one of the one or more first rows of first pins includes a first group of the first pins extending in a first direction and a second group of the first pins extending in a second direction that is different from the first direction. The host board includes vias, where at least a portion of the first and second groups of first pins are connected with a first portion of the vias by way of first solder joints.

One or more aspects of the subject disclosure include a method for manufacturing a device. The method includes providing a printed circuit board including vias; providing a first connector having a first connector body and one or more first rows of first pins extending from the first connector body, where the first connector facilitates a pluggable connection to a first electrical cable or pluggable transceiver, where at least one of the one or more first rows of pins includes a first group of the first pins extending in a first direction and a second group of the first pins extending in a second direction that is opposite to the first direction; and mounting the first connector on an upper surface of the printed circuit board. The method further includes providing a second connector having a second connector body and one or more second rows of second pins extending from the second connector body, where the second connector facilitates a pluggable connection to a second electrical cable or pluggable transceiver, where at least one of the one or more second rows of pins includes a third group of the second pins extending in the first direction and a fourth group of the second pins extending in the second direction; mounting the first connector on a lower surface of the printed circuit board; forming first solder joints to connect at least a portion of the first and second groups of first pins to a first portion of the vias; and forming second solder joints to connect at least a portion of the third and fourth groups of second pins to a second portion of the vias.

Figure 3A:
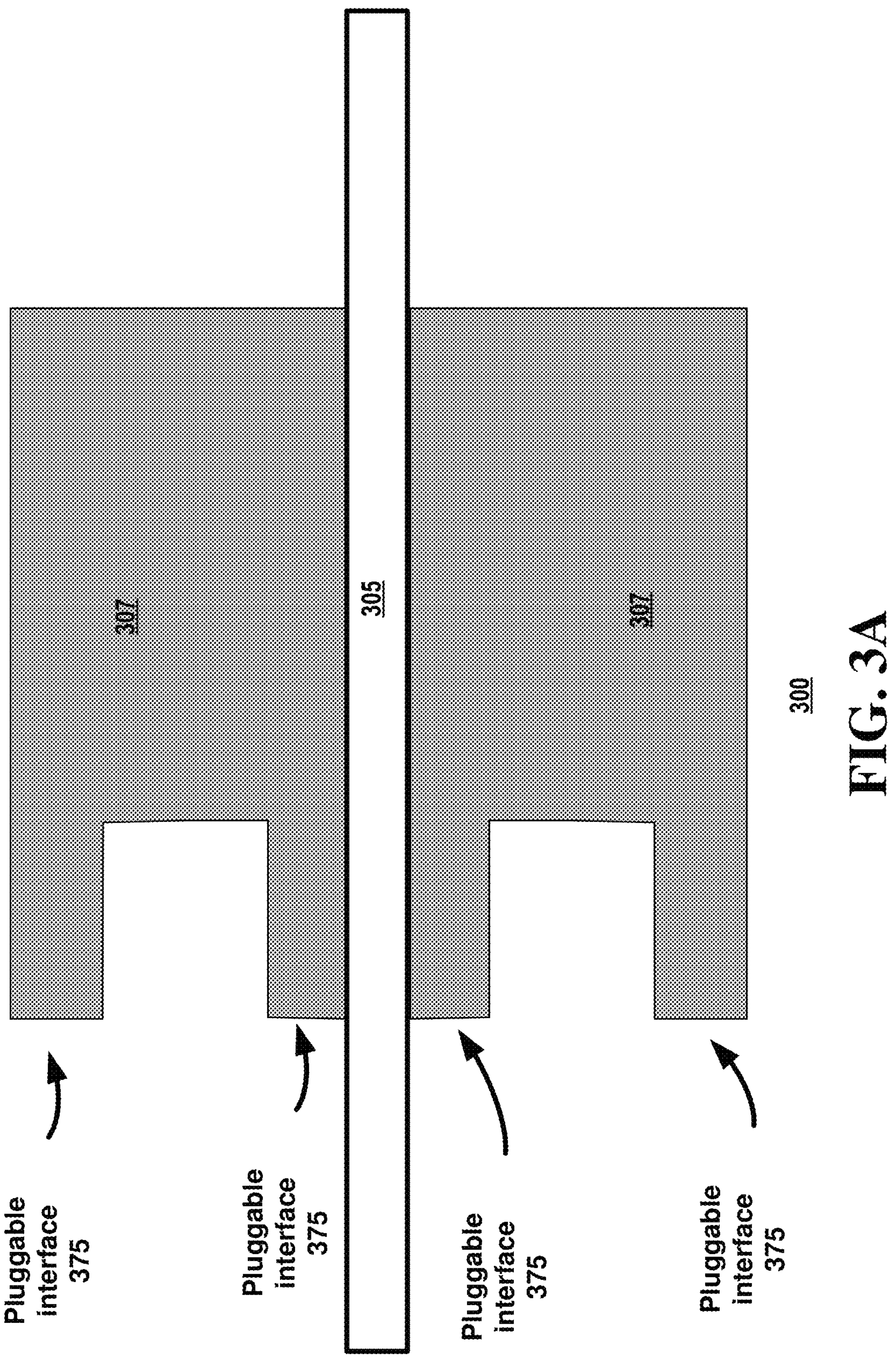
FIG. 3A is a schematic diagram illustrating a portion of a device that includes surface mounted connectors and a host board in accordance with various aspects described herein.
Figures 3B, 3C:
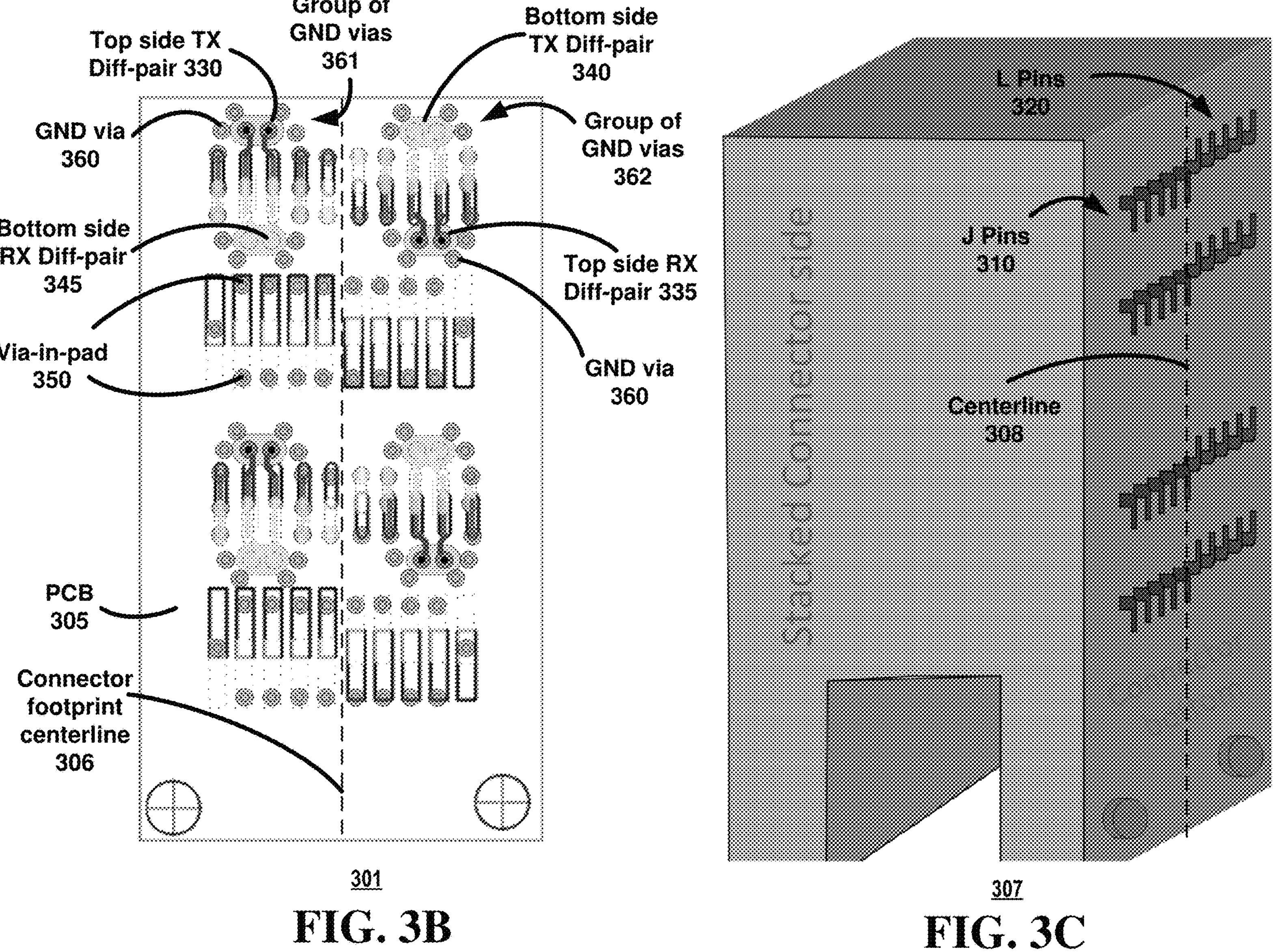
FIG. 3B is a schematic diagram illustrating a layout for the host board that includes the surface mounted connectors of the device of FIG. 3A.
FIGS. 3C and 3D are schematic diagrams illustrating a connector for the device of FIG. 3A.
Figure 3D:
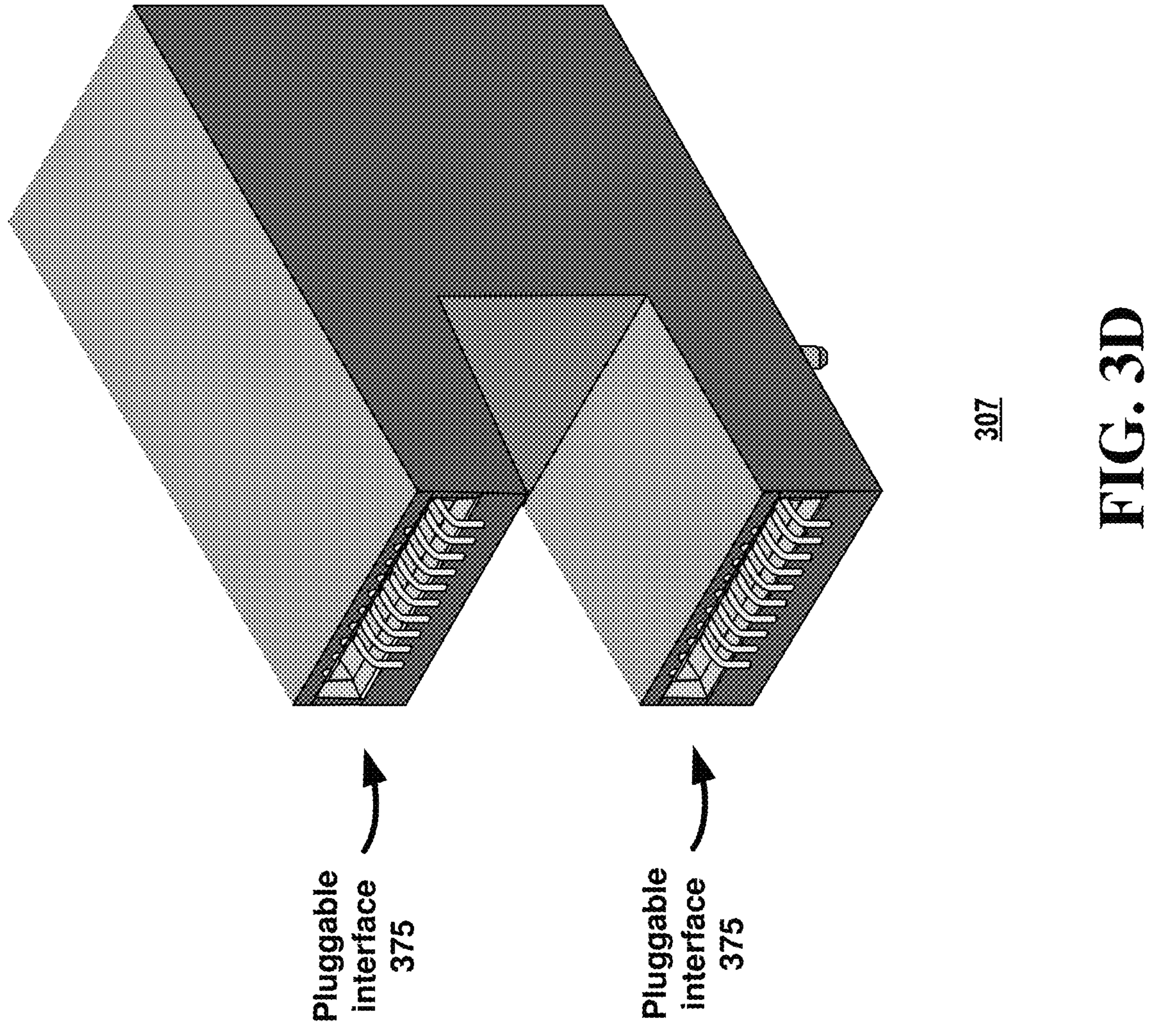
Figure 3E:
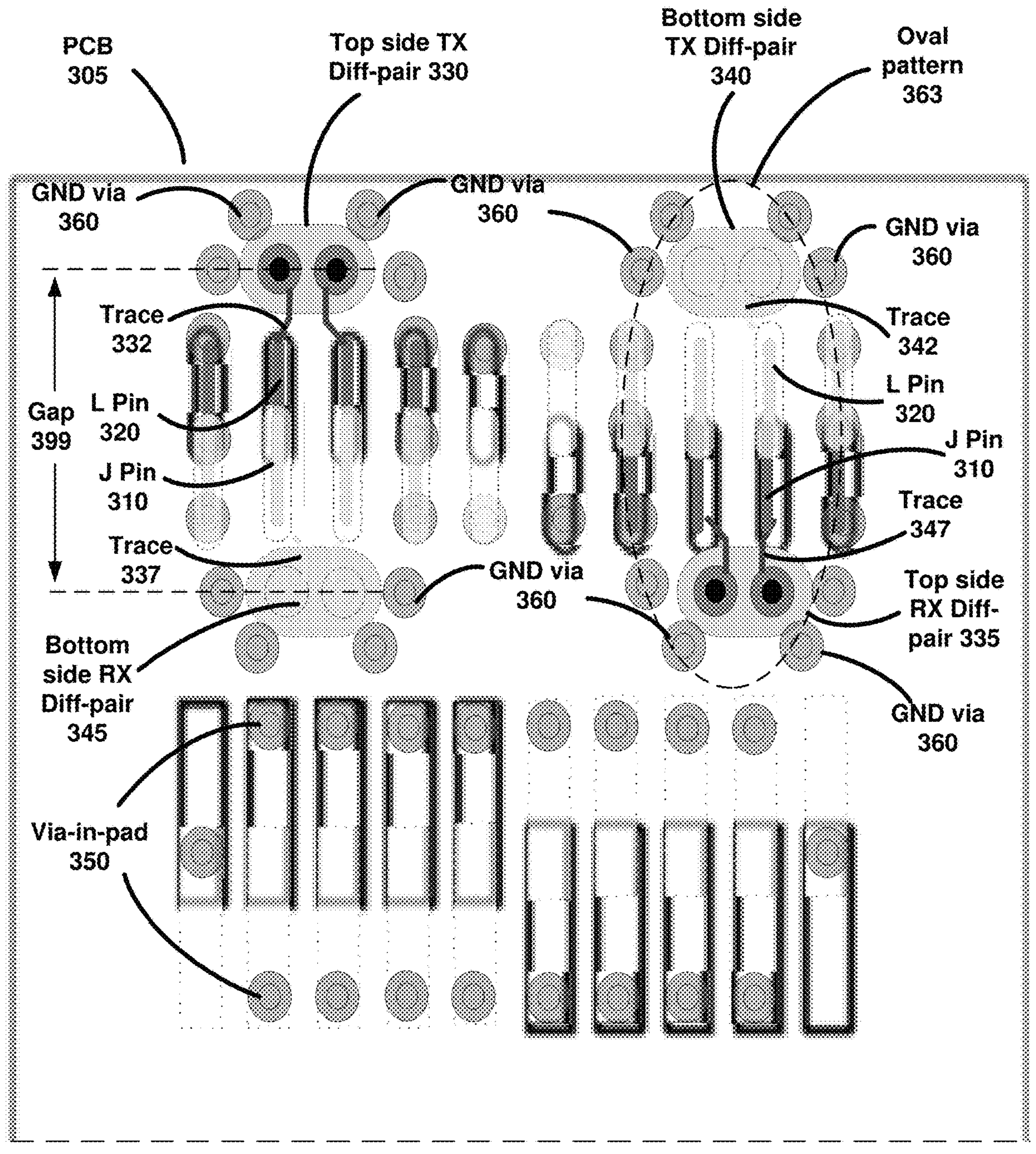
FIG. 3E is a schematic diagram illustrating an enlarged view of the layout of FIG. 3B.

FIGS. 3A-3E illustrate a device 300 (or portion thereof) including a PCB 305 with connectors 307. FIG. 3D illustrates an enlarged view of a section or portion of the layout 301 shown in FIG. 3B. Device 300 includes belly-to-belly placed stacked connectors 307 (one of which is shown in FIG. 3C), however, device 300 can utilize various types of connectors alone or in combination including SFPxx, QSFPxx, and OSFP family connectors. The connectors 307 each have four rows of ten pins each that are "J" pins 310 adjacent to "L" pins 320 in each row. In one or more embodiments, the device 300 can include or be configured to receive various types of connectors, such as for pluggable connection with pluggable transceivers or electrical hard-wires, including single connectors, stacked connectors, belly-to-belly connections to a same host board, and so forth. Any number of rows of pins can be used in the manufactured device 300 including a single row of pins and multiple rows of pins.

In one or more embodiments, each of the rows of the connector(s) 307 utilizes a same pattern for the pins, such as each row having J pins on a left side of an axis of symmetry 308 (shown in FIG. 3C) and L pins on the right side of the axis. In one or more embodiments, each of the rows of the connector(s) utilizes an equal number of pins in the first and second directions (e.g., different directions including opposite directions), such as each row having five J pins on a left side of the axis of symmetry 308 and five L pins on the right side of the axis. Other numbers of pins can also be utilized. In other embodiments, at least one of the one or more rows of pins includes a first group of the pins extending in a first direction and a second group of the pins extending in a second direction that is different (which can include opposite to) from the first direction, where the first group of pins can be adjacent to the second group of pins in the at least one of the one or more rows. In other embodiments, groups of the pins extending in different directions (which can include opposite) may not be adjacent to each other. As an example, one or more rows of pins can include a first group of the pins extending in a first direction and a second group of the pins extending in a second direction that is different from the first direction, where the first group of pins may or may not be adjacent to the second group of pins in at least one of the one or more rows. In one or more embodiments, the group of pins in different directions are not adjacent to each other. In one or more embodiments, a gap or other feature can separate the groups (e.g., two groups). In one or more embodiments, there can be more than two groups, such as a third group of pins with a same or non-opposite direction as compared to one of the other groups of pins.

In one embodiment, each of the rows of the connector(s) 307 can utilize an unequal number of pins in the first and second directions (e.g., different directions including opposite directions), such as each row having three J pins that are adjacent to seven L pins (i.e., an axis of symmetry would not exist in this embodiment along a centerline of the connector body for the pins). Other numbers of pins can also be utilized.

In one or more embodiments, ground (or guard) vias (e.g., GND vias 360 in FIGS. 3B, 3E) can be included for shielding signals (e.g., high speed signals), such as ground vias being connected to zero volt potential to shield signals from external noise and also prevent high frequency energy from escaping and causing electromagnetic interference problems. In one or more embodiments, the ground vias can be located or positioned along the host board (e.g., PCB 305 in FIG. 3B) to surround TX and RX differential pairs on opposing sides of the host board, such as in an oval pattern(s) 363 and/or other symmetrical pattern(s).

In one or more embodiments, the pattern 363 or group of ground vias 360 can encircle one or more high speed traces (e.g., traces 332, 337, 342, 347) on the host board.

In one or more embodiments, a first pair of traces 332 and/or 337 on a left side of a centerline axis 306 (connector footprint centerline) of the PCB 305 can be bounded by or encircled by a first group 361 of ground vias 360 while a second pair of traces 342 and/or 347 on a right side of the centerline 306 of the PCB 305 can be bounded by or encircled by a second group 362 of ground vias 360, such as illustrated in FIG. 3B. In this example, each pair of traces on each side of the centerline 306 can escape in opposite directions from the pads and each pair of traces may not have any common ground vias shared.

In one or more embodiments for high-speed signal devices, microstrip routing can be reduced or avoided in order to best control the trace impedance. In one or more embodiments, inner layer stripline routing can be utilized for high speed routing where possible.

In one or more embodiments, the host board or PCB 305 includes one or more vias that are positioned or located at the toe(s) of the pad(s) of the host board.

In one or more embodiments, the layout 301 enables TX vias 330 from the top connector 307 to avoid being directly adjacent to the RX vias 345 from the bottom connector. Similarly, RX vias 335 from the top connector 307 are not directly adjacent to the TX vias 340 from the bottom connector. Instead, the use of pins in each row facing different or opposite directions, enables trace escape in different or opposite directions and thus provides a gap 399 of a sufficient threshold to avoid undesired conditions including: microstrip traces passing directly beneath the boundary of the connectors where the SFP press-fit cage would be installed, a proximity of the cage to the surface of the PCB interacting with the microstrip routed signals which adds discontinuity and also radiated emissions concerns. Further, the layout 301 avoids the high-speed area of the connectors becoming very crowded with GND return vias (in an irregular or non-symmetrical pattern) and avoids requiring additional anti-pad spacing for signal separation of the RX and TX signal vias. In one or more embodiments, the length of gap 399 can be selected according to various factors such as types of connectors being used, parameters of signals to be communicated via the device, a desired trace length, RX/TX crosstalk tolerance due to close via proximity, spacing for via placement near signal pins, impedance matching, manufacturing criteria, cost, and so forth.

The layout 301 facilitates impedance control and avoids discontinuity which would result if extended microstrip traces were required. The layout 301 does not require adding a longer segment of outer layer (microstrip) trace between the connector pad and the layer-transition vias. Impedance control of microstrip traces has a worse accuracy tolerance, which can result in poor impedance matching with the connector, vias, and stripline (inner layer) routing. The layout 301 further avoids, reduces or mitigates issues with microstrip trace impedances being affected by solder-mask, Cu plating process, and proximity of components/cables/etc. to the surface of the PCB. These impedance discontinuities are avoided which thus avoids, reduces or mitigates reflections, return loss, signal attenuation, and ultimately SERDES eye closure.

The layout 301 further avoids, reduces or mitigates issues with crosstalk because the RX/TX vias are no longer in close proximity and instead are separated by gap 399.

The layout 301 further avoids, reduces or mitigates via-crowding where via anti-pads can impede GND and Power planes, blocking power and return paths. To overcome issues associated with: (1) excessive microstrip routing length, (2) RX/TX crosstalk due to close via proximity, and (3) crowded via placement near signal pins, the orientation of the pins 310, 320 within a row on either side of the centerline 306 (e.g., an axis or line of symmetry of the connector footprint) can be in different directions. This allows the pins on one side of the connector to escape the footprint pads in one direction while the pins on the adjacent side of the connector to escape in the other direction.

In one or more embodiments, the layout 301 can include via-in-pad structure 350 to be used for the low-speed signals (MOD_PRSn, SCL/SDA, etc.)

Figure 4:
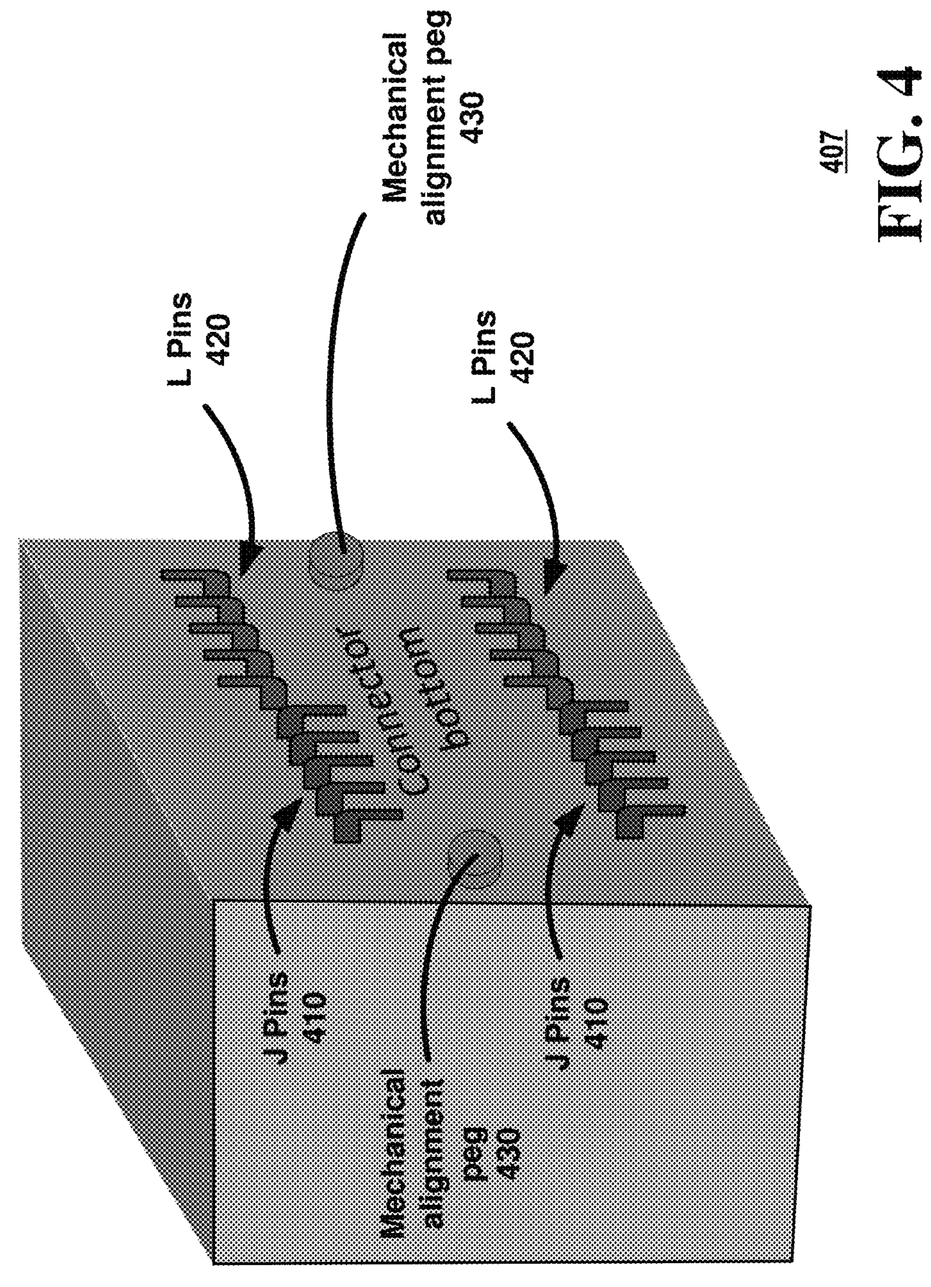
FIG. 4 is a schematic diagram illustrating another surface mounted connector in accordance with various aspects described herein.

FIG. 4 illustrate a connector 407 that can be mounted on a PCB (including in a belly-to-belly configuration. Connector 407 has two rows of ten pins each that are a series of "J" pins 410 adjacent to a series of "L" pins 420 in each row. In one or more embodiments, the connector 400 can be utilized with various host boards (including PCBs) as a pluggable connection with pluggable transceivers and/or electrical hardwires. Any number of rows of pins 410, 420 can be used in the connector 407 including a single row of pins or more than two rows of pins.

In one or more embodiments, each of the rows of the connector(s) 407 utilizes a same pattern for the pins, such as each row having J pins on a left side of an axis of symmetry and L pins on the right side of the axis. In one or more embodiments, one or more of the rows of the connector(s) utilizes an equal number of pins in the first and second directions (e.g., different directions including opposite directions). In one embodiment, each of the rows of the connector (s) 407 can utilize an unequal number of pins in the first and second directions (e.g., different directions including opposite directions), such as each row having three J pins that are adjacent to seven L pins (i.e., an axis of symmetry would not exist in this embodiment along a centerline of the connector body for the pins). Various techniques and structures can be utilized for connecting the connector 407 with the host board including alignment pegs 430. In one or more embodiments, the rows of the connector(s) can utilize different patterns for the pins, such as one row having J pins on a left side of an axis of symmetry and L pins on the right side of the axis, while other row(s) have different patterns.

Figure 5:
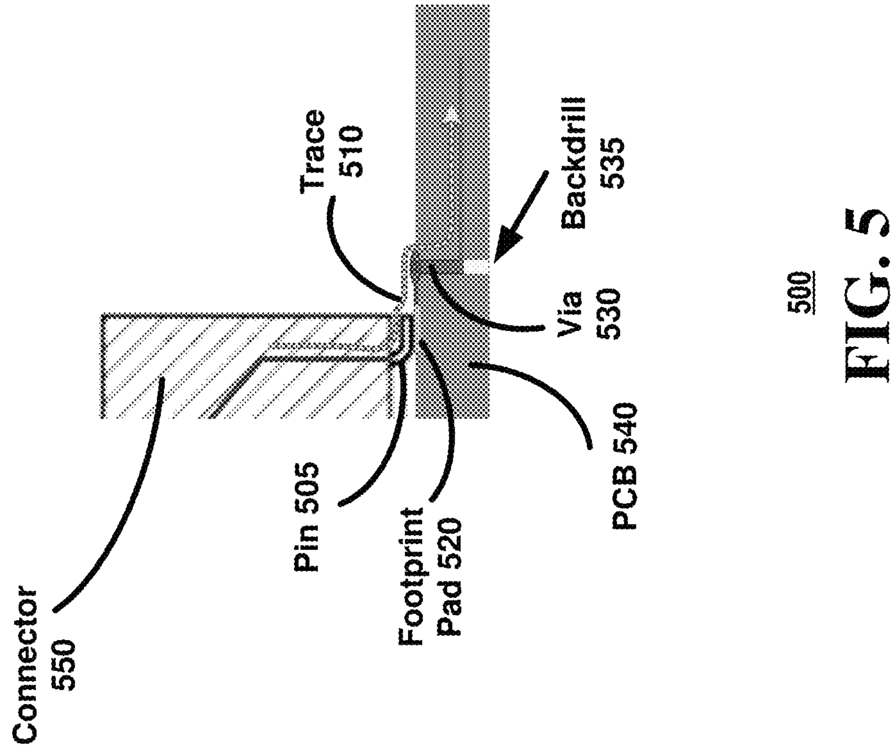
FIG. 5 is a schematic diagram illustrating a portion of a device that includes a surface mounted connector(s) and host board in accordance with various aspects described herein.

FIG. 5 illustrate a portion of a device 500 including a PCB 540 with a connector 550. Connector 550 can be various types of connectors including SFPxx, QSFPxx, and OSFP family connectors. Connector 550 can have any number of rows (only one of which is shown) of any number of pins (only one of which is seen in the side view of the portion of the connector 550). In this embodiment, L pin 505 is illustrated with an improved or optimized trace escape for the trace 510 where the via 530 (which can be formed via a backdrill 535) is located or otherwise positioned at the "toe" of the pin 505 and the footprint pad 520. This configuration eliminates any stub being formed in the signal path, which could cause signal reflections.

Figure 6:
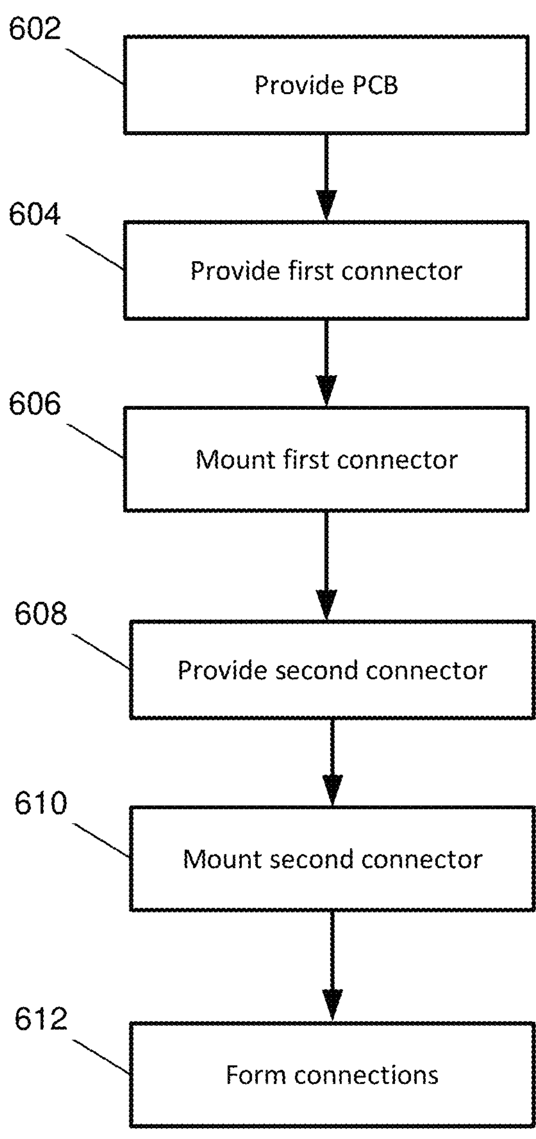
FIG. 6 depicts an illustrative embodiment of a device manufacturing process in accordance with various aspects described herein.

FIG. 6 depicts an illustrative embodiment of a process 600 for manufacturing a device or a portion thereof in accordance with various aspects described herein. The device can be various types of devices, including high-speed connection devices (e.g., 56 Gbps, 112 Gbps or higher) on a host board for optical fiber or electrical/hardwire connections such as pluggable transceiver(s). In one or more embodiments, the process 600 can adhere to and/or add to the guidelines and features described in Multiple Source Agreement (MSA) standards, such as SFP-DD-MSA (SFP-DD/SFP-DD112/SFP112 Hardware Specification for SFP112 AND SFP DOUBLE DENSITY PLUGGABLE TRANSCEIVER), QSFP-DD-MSA (QSFP-DD/QSFP-DD800/QSFP112 Hardware Specification for QSFP DOUBLE DENSITY 8× AND QSFP 4× PLUGGABLE TRANSCEIVERS), INF-8074i (SFP Transceiver), SFF-8431 (SFP+ 10 Gb/s and Low Speed Electrical Interface), SFF-8432 (SFP+ Module and Cage), INF-8077i (10 Gigabit Small Form Factor Pluggable Module), Xenpak MSA (Xenpak MSA), X2 MSA (X2 MSA), CFP MSA (CFP MSA Hardware Description), CFP MSA (CFP2 Hardware Specification), CFP MSA (CFP4 Hardware Specification), CFP MSA (CFP8 Hardware Specification), SFF-8436 (QSFP+ 10 Gbs 4× Pluggable Transceiver), SFF-8665 (QSFP+ 28 Gb/s 4× Pluggable Transceiver Solution), QSFP-DD MSA (QSFP Double Density 8× Pluggable Transceiver), the disclosures of all of which are hereby incorporated by reference.

At 602, a PCB (e.g., PCB 305, PCB 540 or another PCB) can be provided or otherwise obtained. The PCB can be designed to include vias (e.g., TX vias, RX vias, GND vias, power vias) or otherwise adapted or configured with the vias, such as through backdrilling. The PCB can be designed to include footprint pads or otherwise adapted or configured with footprint pads. The particular locations of the vias, footprint pads and other components facilitate traces to escape the connector(s) footprints in an improved or optimized manner which mitigates, minimizes or eliminates signal discontinuities and/or stub reflections, and further mitigates, minimizes or eliminates cross-talk, such as by allowing layer transition vias for RX/TX differential pairs to be located further apart.

At 604, a first connector can be provided or otherwise obtained. The first connector can include a first connector body and one or more rows of first pins extending from the first connector body, where the first connector facilitates a pluggable connection to a first electrical or fiber cable, where each of the one or more rows of pins includes a first group of the first pins extending in a first direction and a second group of the first pins extending in a second direction that is different from (e.g., opposite to) the first direction, and where the first group of first pins may or may not be adjacent to the second group of first pins in each of the one or more first rows. As an example, the first connector can have an axis of symmetry (e.g., centerline) where each of the rows of pins can have a set of J pins on one side of the axis and a set of L pins on the other side of the axis. Other shapes of pins and/or directions of the pins can also be utilized which reduce or eliminate excessive microstrip routing length, RX/TX crosstalk due to close via proximity, and crowded via placement near signal pins.

At 606, the first connector can be aligned and mounted on a first (e.g., upper) surface of the PCB. As an example, this can be done through the use of IR reflow soldering process where one or more (two are shown) alignment pegs assist with precise mechanical positioning of the connector, although other connection members and/or techniques can be utilized.

At 608, a second connector can be provided or otherwise obtained. The second connector can include a second connector body and one or more rows of second pins extending from the second connector body, where the second connector facilitates a pluggable connection to a second electrical cable or pluggable transceiver, where each of the one or more rows of pins includes a third group of the second pins extending in the first direction and a fourth group of the second pins extending in the second direction, wherein the third group of second pins may or may not be adjacent to the fourth group of second pins in each of the one or more rows. As an example, the first and second connectors can be a same connector with a same configuration (e.g., size, shape, J and L pins, and so forth).

At 610, the second connector can be mounted on a second (e.g., lower) surface of the PCB. As an example, this can be done through the use of IR reflow soldering process where one or more (two are shown) alignment pegs assist with precise mechanical positioning of the connector, although other connection members and/or techniques can be utilized.

At 612, connections can be formed for one, some or all of the pins of the connectors. As an example, first solder joints can be formed to connect at least a portion of the first and second groups of first pins to a first portion of the vias; and second solder joints can be formed to connect at least a portion of the third and fourth groups of second pins to a second portion of the vias.

One or more of the embodiments describe use of J pins and L pins in a row that have different or opposite directions. It should be further understood that the pins in the row(s) are not limited to J pins and L pins, and could utilize other shapes of pins that facilitate manufacture and/or facilitate operation, where one or more rows of pins includes a first group of the pins extending in a first direction and a second group of the pins extending in a second direction that is different from the first direction (including opposite in direction). In one or more embodiments, the first group of pins is adjacent to the second group of pins in each of the one or more rows.

One or more of the embodiments describe one or more connectors that are mounted to a host board such as a PCB and that facilitate a pluggable connection to electrical cable or pluggable transceiver, however, in one or more embodiments, the connectors can be for other types of connections which may not be pluggable.

One or more of the embodiments describe a pin configuration for one or more connectors that are mounted to a host board such as a PCB and that facilitate a pluggable connection to electrical cable or pluggable transceiver, however, in one or more embodiments, the pin configuration can be utilized with other types of SMT components that are to be mounted to a host board and that utilize pins, traces and/or vias as described herein.

Various other techniques and steps can be utilized in method 600 to facilitate manufacturing a device or a portion thereof in accordance with various aspects described herein where the device can be various types of devices, including high-speed connection devices (e.g., 56 Gbps, 112 Gbps or higher) on a host board for optical fiber or electrical/hardwire connections such as pluggable transceiver(s). Various other materials and components can further be utilized in the method 600 (as well as in conjunction with the exemplary embodiments described herein) as would be understood by one of ordinary skill in the art.

While for purposes of simplicity of explanation, the respective processes are shown and described as a series of blocks in FIG. 6, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

The terms "first," "second," "third," and so forth, as used in the claims, unless otherwise clear by context, is for clarity only and does not otherwise indicate or imply any order in time. For instance, "a first determination," "a second determination," and "a third determination," does not indicate or imply that the first determination is to be made before the second determination, or vice versa, etc.

Moreover, it will be noted that the disclosed subject matter can be practiced with various computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be in both local and remote memory storage devices.

Further, the various embodiments can be implemented as a method, apparatus or article of manufacture using standard programming and/or engineering techniques to produce software, firmware, hardware, or any combination thereof to control a computer to implement the disclosed subject matter. The term "article of manufacture" as used herein is intended to encompass semiconductor devices, wafers, integrated circuits, circuit modules, modules, systems and/or components incorporating semiconductor devices, as well as a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to," "coupled to," and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature, or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all the features described with respect to an embodiment can also be utilized.

What is claimed is:

1. A device, comprising:

a first connector comprising a first connector body that facilitates a first pluggable connection to a first electrical cable or a first pluggable transceiver, the first connector body further comprising one or more rows of first pins extending from a surface of the first connector body, wherein at least one of the one or more rows of the first pins includes a first group of the first pins extending in a first direction and a second group of the first pins extending in a second direction that is opposite the first direction;

a host board comprising vias, wherein the first connector is mounted on a first surface of the host board and at least a portion of the first and second groups of the first pins are connected to the vias by way of first solder joints; and a second connector comprising a second connector body that facilitates a second pluggable connection to a second electrical cable or a second pluggable transceiver, the second connector body further comprising one or more rows of second pins extending from a surface of the second connector body, wherein at least one of the one or more rows of the second pins includes a third group of the second pins extending in the first direction and a fourth group of the second pins extending in the second direction, and wherein the second connector is mounted on a second surface of the host board opposite the first surface and at least a portion of the third and fourth groups of the second pins are connected to the vias by way of second solder joints.

2. The device of claim 1, wherein the host board is a printed circuit board.

3. The device of claim 1, wherein the first group of the first pins is J-pins and the second group of the first pins is L-pins, and wherein the first group of the first pins is adjacent to the second group of the first pins in the at least one of the one or more rows of the first pins.

4. The device of claim 1, wherein the one or more rows of the first pins are one row, two rows, or four rows.

5. The device of claim 1, wherein the first group of the first pins is equal in number to the second group of the first pins.

6. The device of claim 1, wherein the first connector body has an axis of symmetry, and wherein the first group of the first pins is on an opposite side of the axis of symmetry as compared to the second group of the first pins.

7. The device of claim 1, wherein the surface of the first connector body includes a plurality of mechanical alignment pegs for physically aligning the first connector body to the host board.

8. The device of claim 1, wherein the first and second directions of the first and second groups of the first pins facilitate the first and second groups of the first pins being connected to the vias by way of the first solder joints being at a toe of each respective first pin.

9. The device of claim 1, wherein locations of the vias and the first and second directions of the first and second groups of the first pins facilitate the first and second groups of the first pins being connected to the vias by way of the first solder joints being formed without stubs in the first solder joints.

10. A device, comprising:

a first connector having a first connector body and one or more first rows of first pins extending from the first connector body, wherein the first connector facilitates a pluggable connection to a first electrical cable or a first pluggable transceiver, and wherein at least one of the one or more first rows of the first pins includes a first group of the first pins extending in a first direction and a second group of the first pins extending in a second direction that is different from the first direction;

a host board including vias, wherein at least a portion of the first and second groups of the first pins are connected to a first portion of the vias by way of first solder joints, and wherein the first connector is mounted on an upper surface of the host board; and a second connector having a second connector body and one or more second rows of second pins extending from the second connector body, wherein the second connector facilitates a pluggable connection to a second electrical cable or a second pluggable transceiver, wherein at least one of the one or more second rows of the second pins includes a third group of the second pins extending in the first direction and a fourth group of the second pins extending in the second direction, wherein at least a portion of the third and fourth groups of the second pins are connected to a second portion of the vias by way of second solder joints, and wherein the second connector is mounted on a lower surface of the host board.

11. The device of claim 10, wherein the host board is a printed circuit board, wherein the first direction is opposite the second direction, wherein the first group of the first pins is adjacent to the second group of the first pins in the at least one of the one or more first rows, and wherein the third group of the second pins is adjacent to the fourth group of the second pins in the at least one of the one or more second rows.

12. The device of claim 10, wherein the first group of the first pins and the third group of the second pins are J-pins, and wherein the second group of the first pins and the fourth group of the second pins are L-pins.

13. The device of claim 10, wherein the one or more first rows and the one or more second rows are single rows, two rows, or four rows.

14. The device of claim 10, wherein the first group of the first pins, the second group of the first pins, the third group of the second pins, and the fourth group of the second pins are equal in number.

15. The device of claim 10, wherein the first and second connector bodies each have an axis of symmetry, wherein the first and second groups of the first pins are on opposite sides of the axis of symmetry of the first connector body, and wherein the third and fourth groups of the second pins are on opposite sides of the axis of symmetry of the second connector body.

16. The device of claim 10, wherein the first and second connector bodies include a plurality of alignment pegs for physically connecting to the upper and lower surfaces of the host board.

17. The device of claim 10, wherein the first and second directions of the first and second groups of the first pins and the third and fourth groups of the second pins respectively facilitate connection with the vias by way of the first and second solder joints being at a toe of each respective pin.

18. The device of claim 10, wherein locations of the vias and the first and second directions of the first and second groups of the first pins and the third and fourth groups of the second pins respectively facilitate connection with the vias by way of the first and second solder joints being formed without stubs in the first and second solder joints.

19. A method for manufacturing a device, comprising:

providing a printed circuit board including vias;

providing a first connector having a first connector body and one or more first rows of first pins extending from the first connector body, wherein the first connector facilitates a pluggable connection to a first electrical cable or a first pluggable transceiver, and wherein at least one of the one or more first rows of the first pins includes a first group of the first pins extending in a first direction and a second group of the first pins extending in a second direction that is opposite the first direction;

mounting the first connector on an upper surface of the printed circuit board;

providing a second connector having a second connector body and one or more second rows of second pins extending from the second connector body, wherein the second connector facilitates a pluggable connection to a second electrical cable or a second pluggable transceiver, and wherein at least one of the one or more second rows of the second pins includes a third group of the second pins extending in the first direction and a fourth group of the second pins extending in the second direction;

mounting the second connector on a lower surface of the printed circuit board;

forming first solder joints to connect at least a portion of the first and second groups of the first pins to a first portion of the vias; and forming second solder joints to connect at least a portion of the third and fourth groups of the second pins to a second portion of the vias.

20. The method of claim 19, wherein the first connector body includes a plurality of mechanical alignment pegs, the method further comprising aligning the first connector to the printed circuit board using the plurality of mechanical alignment pegs before mounting the first connector on the printed circuit board.

* * * * *